United States Patent [19]
Santos

[11] Patent Number: 4,578,594
[45] Date of Patent: Mar. 25, 1986

[54] CIRCUIT AND METHOD FOR SPLIT BIAS ENABLE/INHIBIT MEMORY OPERATION

[75] Inventor: Joe Santos, Lafayette, Calif.

[73] Assignee: Fairchild Camera & Instrument Corporation, Palo Alto, Calif.

[21] Appl. No.: 573,532

[22] Filed: Jan. 25, 1984

[51] Int. Cl.⁴ .................. H03K 17/56; H03K 5/22
[52] U.S. Cl. .................................... 307/241; 307/494
[58] Field of Search ............................. 307/240–245, 307/494, 498; 328/99

[56] References Cited

U.S. PATENT DOCUMENTS

| | | | |
|---|---|---|---|
| 3,838,296 | 9/1974 | Mcleod | 307/243 |
| 4,037,118 | 7/1977 | Sieborger et al. | 307/243 |
| 4,349,750 | 9/1982 | Geurts | 307/244 |
| 4,382,197 | 5/1983 | Kiyozuka | 307/470 |

Primary Examiner—Stanley D. Miller
Assistant Examiner—B. R. Davis
Attorney, Agent, or Firm—Carl L. Silverman; Stephen J. Phillips; Robert C. Colwell

[57] ABSTRACT

A circuit and method for enabling/disabling a differential signal output from a memory device, such as a bipolar static random access memory, is disclosed. A split bias, current steering circuit includes a first differential amplifier for steering a current $I_D$ along a first current path when a first selected differential input signal, corresponding to a first logic state, is coupled to a first input terminal of said first differential amplifier; and includes a second differential amplifier for steering current $I_D$ along a second current path when a second selected differential input signal, corresponding to a second logic state, is coupled to a second input terminal of said second differential amplifier. An output stage produces a selected logic output signal according to which of said first and second current paths is selected to steer current $I_D$. A split bias enable/inhibit stage provides controlled operation of the first and second differential amplifiers. Circuit operation is inhibited by splitting a bias signal supplied to the differential amplifiers. When inhibited, the circuit steers current $I_D$ along a predetermined one of said first and second current paths. This produces a corresponding continual predetermined logic output signal without regard to the differential input signal present at the first and second input terminals. Circuit operation is enabled by balancing the bias signal supplied to the differential amplifiers. When enabled, both differential amplifiers connected to the output stage are operative.

11 Claims, 2 Drawing Figures

CIRCUIT AND METHOD FOR SPLIT BIAS ENABLE/INHIBIT MEMORY OPERATION

BACKGROUND OF THE INVENTION

1. Field of the Invention

The present invention relates to a circuit and method for selectively enabling and disabling a split differential amplifier. More particularly, the present invention relates to a circuit and method for combining the functions of signal amplifying, buffering, and output enabling in a memory device by use of split bias enabling.

2. Description of the Prior Art

Circuits and techniques for communicating the contents of a solid state memory to other devices are well known. Such circuits receive a differential input, indicative of memory cell contents at an associated memory location, and produce a corresponding logic level output signal. A memory select or output enable/inhibit feature is typically included with such circuits. Accordingly, an output signal is produced only when required and as selected.

FIG. 1 shows a prior art differential applifier circuit 10, which consists of transistors Q1–Q4 and resistors R1 and R2. A logic high or low output signal is produced at transistor Q9; output enable/inhibit is controlled by transistors Q5–Q8.

In operation, if the memory cell contents to be transferred by circuit 10 are a logic high, a logic high signal IN+ is present at the base of transistor Q1 and a logic low signal In- is present at the base of transistor Q4. As a result, a current $I_D$ is steered through resistor R1 and thereafter through each of transistors Q1 and Q3. Current $I_D$ is split at the collectors of transistors Q1 and Q3. A current $I_D/2$ flows through each of transistors Q1 and Q3 and, thereafter, through transistors Q7 and Q8, respectively.

No voltage drop is developed across resistor R2 as a result of steering current $I_D$ through transistors Q1 and Q3. The voltage is coupled to the base of transistor Q9, turning transistor Q9 on, and producing a logic high output signal at the emitter of transistor Q9.

If the memory contents transferred by circuit 10 are a logic low, a logic low input signal is present at the base of transistor Q1, and a logic high signal is present at the base of transistor Q4. As a result, current $I_D$ is steered through resistor R2 and thereafter through each of transistors Q2 and Q4; current $I_D/2$ flows through each of transistors Q2 and Q4 and thereafter, through transistors Q7 and Q8, respectively. The voltage drop developed across resistor R2 and coupled to the base of transistor Q9 turns transistor Q9 off because current $I_D$ is now steered through resistor R2 and transistors Q2 and Q4. Therefore, a logic low output signal is produced at the emitter of transistor Q9.

A BIAS 1 signal, present at the base of transistors Q2, Q3, and Q5, sets a voltage level relative to which input signal IN+ must be more positive and relative to which input signal IN− must be more negative if circuit 10 is to produce a logic high output at the emitter of transistor Q9. BIAS 1 signal also sets the voltage level relative to which input signal IN+ must be more negative and relative to which input signal IN− must be more positive if circuit 10 is to produce a logic low output at the emitter of transistor Q9.

A second BIAS signal—BIAS 2—is coupled to the base of transistors Q7 and Q8 to establish an output enable voltage level. An output enable signal OE is coupled to the base of transistor Q6. Circuit 10 is operated when output signal OE is a logic low relative to the BIAS 2 signal. When output enable signal OE is a logic high relative to the BIAS 2 signal, transistor Q6 conducts and steers current $I_D$ through transistors Q5 and Q6 through resistor R2 producing a voltage drop across resistor R2. As a result, a logic low output signal is produced at the emitter of transistor Q9, without regard to logic input signals IN+ and IN−.

When the circuit is enabled, differential amplifier pairs consisting of transistors Q1 and Q2, and Q3 and Q4 are operative as follows:

|  | Reading a "1" | Reading a "0" |
|---|---|---|
| IN+ (base Q1) | high relative to Bias 1 | low relative to Bias 1 |
| IN(−) (base Q4) | low relative to Bias 1 | high relative to Bias 1 |
| Q1 | On | Off |
| Q2 | Off | On |
| Q3 | On | Off |
| Q4 | Off | On |
| I thru R2 | ∅ | ~$I_D$ |

When disabled transistors Q7 and Q8 are off and transistor Q6 is on. The transistor Q1, Q2 and transistor Q3, Q4 differential amplifiers are not operative as follows:

|  | Disabled | Enabled |
|---|---|---|
| Q1 | inoperative | depends on |
| Q2 | no emitter | logic state at |
| Q3 | current | input IN+ IN− |
| Q4 | Q7, Q8 are off | (see above) |
| Q5 | On | Off |
| Q6 | On | Off |
| Q7 | Off | On |
| Q8 | Off | On |

One disadvantage of such prior art circuits is the need to provide a current path through transistors Q7 and Q8. Such transistors must be, of necessity, large in size to steer current $I_D$ (which may be on the order of 6 milliamperes). Such large transistors slow circuit response time by increasing circuit parasitic capacitance. Precise current steering also is inhibited by transistors Q7 and Q8, unless identical matched transistors are used to balance the transistor's steering of current $I_D$.

The additional functional elements required by prior art enabling circuits increase both space and power requirements, while substantially slowing circuit response time. These limitations are particularly noticeable in high speed electronic devices, such as solid state memory circuits.

SUMMARY OF THE INVENTION

The present invention combines the functions of signal amplifying, buffering, and output enabling. The invention consists of a differential amplifier stage, an output stage, and an enable/inhibit stage. The differential amplifier stage includes two differential transistor pairs coupled to steer a current $I_D$ along one of two selected current paths. When operated in conjunction with a solid state memory circuit, the differential amplifying stage controls the output stage to produce an output logic signal that corresponds to a differential logic input signal.

The differential transistor pairs each include an input terminal that is coupled to detect a logic high signal IN+ or a logic low signal IN−, respectively. Current $I_D$ is steered along one of the two current paths in response to the logic signal level detected by the differential transistor pairs. Output stage operation is a function of current $I_D$ flow along one of the two selected current paths.

The enable/inhibit stage maintains a balanced bias signal on a control terminal portion of each of the differential transistor pairs to enable circuit operation. Circuit operation is inhibited when the bias signal is split or unbalanced. In such condition, current $I_D$ is continually steered along a corresponding logic low current path. This produces a continual logic low output signal that remains unaffected by varying input conditions at the differential transistor pairs.

Accordingly, the present invention provides a split bias current steering circuit that, when enabled, provides a selected logic output signal corresponding to a differential logic input signal. Current flow in the circuit is evenly divided between two active devices, e.g., one transistor "leg" of each of the two differential transistor pairs. As a result, the required power handling capacity of the active devices in the circuit may be significantly reduced without affecting circuit operation or reliability. The size of the circuit functional elements, such as the differential transistors, is accordingly reduced, as is the space necessary to integrate the circuit onto a monolithic substrate (or to lay out the circuit on a printed circuit board if discrete devices are used).

The number of functional elements required to implement the present invention also is significantly reduced. This reduction in circuit overhead and the small size of the functional elements used in the circuit, significantly reduces parasitic capacitance and current loading. As a result, extremely fast circuit response time is advantageously provided by the present invention. The invention's fast response time makes it particularly useful in memory circuits where rapid and reliable data transfer is critical.

DETAILED DESCRIPTION OF A PREFERRED EMBODIMENT

Figure 1:
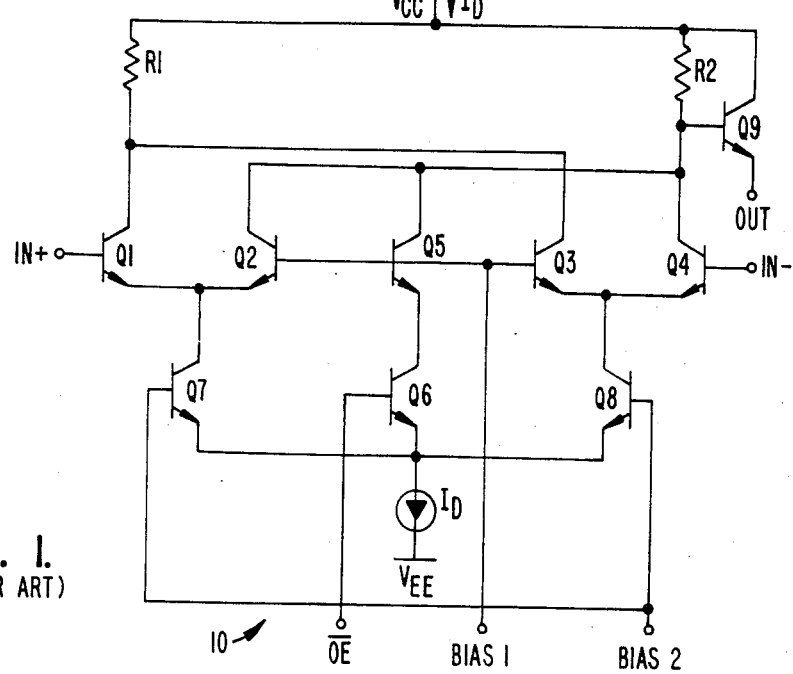
FIG. 1 is a schematic diagram of a prior art memory enable/inhibit circuit.
Figure 2:
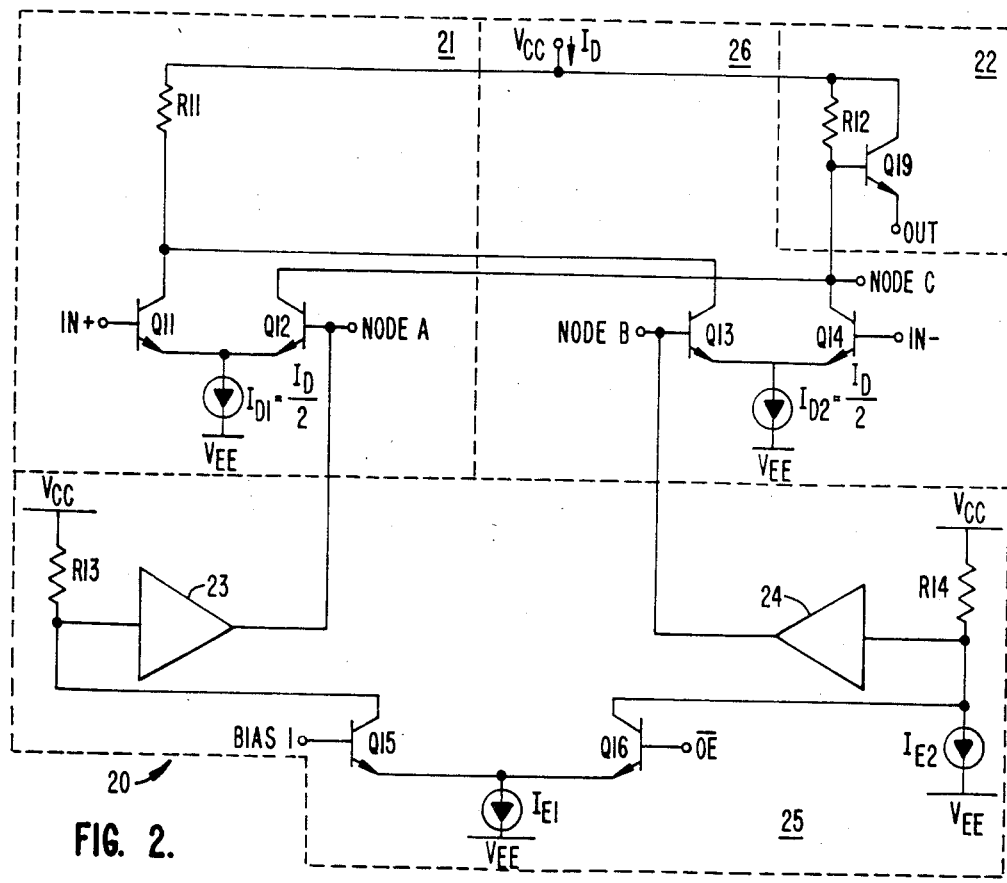
FIG. 2 is a schematic diagram of an exemplary split bias enable/inhibit circuit according to the present invention.

A schematic diagram of an exemplary embodiment of the invention, a split bias enable/inhibit circuit 20, is shown in FIG. 2. The invention combines the functions of signal amplifying, buffering, and output signal enable/inhibit. Although the preferred embodiment of the invention incorporates a split differential amplifier, it should be appreciated that the present invention can also provide enable/inhibit control of standard differential amplifier circuits.

In the embodiment of the invention shown in FIG. 2, three circuit stages are provided: a differential amplifier pair input stage 21 and 26, an output stage 22, and an enable/inhibit stage 25. The differential amplifier pair input stage 21 and 26 includes differential transistor pairs Q11 and Q12, and Q13 and Q14. The differential transistor pairs are arranged to form two parallel paths for routing current $I_D$, $I_{D1}$, and $I_{D2}$ to current sink $V_{EE}$. The collectors of transistors Q11 and Q13 are coupled to current source $I_D$ through resistor R11 and the collectors of transistors Q12 and Q14 are coupled to current source $I_D$ through resistor R12. This arrangement establishes a first current path through transistors Q11 and Q13 by which a current $I_D/2$ may be conducted through each of transistors Q11 and Q13; and it establishes an alternate current path through transistors Q12 and Q14 by which current $I_D/2$ may be conducted through each of transistors Q12 and Q14.

Output stage 22 includes a transistor Q19 having a collector and base terminal coupled across a resistor R12. An output signal is developed at the emitter of transistor Q9 in accordance with a voltage at its base, established at a circuit node C.

Enable/inhibit stage 25 may be of any type of circuit that provides a selectable balanced/unbalanced (split) bias signal at circuit nodes A and B. The enable/inhibit stage includes a buffer amplifier 23 and 24 coupled to circuit nodes A and B, respectively. Buffer amplifiers 23 and 24 are controlled by transistors Q15 and Q16.

Transistors Q15 and Q16 comprise a differential amplifier. Bias 1 is connected to the base of transistor Q15 and the output enable signal $\overline{OE}$ is connected to the base of transistor Q16. When $\overline{OE}$ is low relative to Bias 1, the output is enabled and transistor Q15 is on and transistor Q16 is off. Current $I_{E1}$ flows through transistor Q15 and resistor R13. Current $I_{E2}$ flows through resistor R14. Currents $I_{E1}$ and $I_{E2}$, and resistors R13 and R14 are chosen so that the voltage drop across resistor R13 is the same as the voltage drop across resistor R14 to force the voltage at node A to be equal to the voltage at node B, between the high and low levels at the bases of transistors Q11 and Q13.

When $\overline{OE}$ is high relative to Bias 1, the output is disabled, and transistor Q15 is off and transistor Q16 is on. Current $I_{E1}$ flows through transistor Q16 and resistor R14; current $I_{E2}$ also flows through resistor R14. Currents $I_{E1}$ and $I_{E2}$, and resistors R13 and R14 are chosen so that the voltage drop across resistor R14 is sufficient to force node B lower than the lowest low level at the base of transistor Q14. Transistor Q14 is now always on steering current $I_{D2}=I_D/2$ out of node C. Voltage $V_{CC}$ and IN+, coupled to the base of transistor Q11, are chosen so that the voltage at node A is always high relative to the voltage at IN+. Transistor Q12 is always on steering current $I_{D1}=I_D/2$ out of node C.

The combination of currents $I_{D1}$ and $I_{D2}$ generate sufficient voltage drop across resistor R12 so that the voltage at node C is low and the output is low.

As an example of circuit operation assume that the contents of a memory cell, are a logic high. Accordingly, a logic high signal is present at the base of transistor Q11 (IN+) and a logic low signal is present at the base of transistor Q14 (IN−). Transistor Q11 conducts, allowing current $I_D$ to flow through resistor R11. Current $I_D$ is split evenly between transistors Q11 and Q13—each of the transistors conducts a current $I_D/2$. Neither of the transistors need be large enough to conduct the entire current $I_D$. Accordingly, the transistors may be smaller in size to resultingly exhibit a faster response time, due to a reduction in the parasitic capacitance associated with larger sized devices.

When logic high signal IN+ is positive relative to node A and IN− is negative relative to node B, current $I_D$ is drawn away from resistor R12. Because there is no current flow through transistors Q12 and Q14, no voltage drop is developed across resistor R12. This voltage is coupled to the base of transistor Q19, turning the transistor on, and a high output signal is produced at the emitter of transistor Q19. In this way, logic high memory contents in a corresponding memory cell are coupled through the circuit, amplified as necessary (by the transistor pairs), and buffered.

When a logic low is stored in a corresponding memory cell, IN− is positive relative to node B and IN+ is negative relative to node A, turning transistors Q12 and Q14 on and routing current $I_D$ through resistor R12. Thereafter, current $I_D$ is split by transistors Q12 and Q14 such that each transistor conducts a current $I_D/2$. Because under these conditions a constant current flows through resistor R12 and transistors Q12 and Q14, there is a voltage drop across resistor R12. Accordingly, a low signal is developed at the base of transistor Q19. The transistor therefore remains turned off and no signal is produced at the emitter of transistor Q19. This condition corresponds to a logic low output signal. In this way, logic low memory contents are coupled through the circuit.

When enabled, the voltages at node A and node B are chosen so that node A is between the high and low level at IN+ and node B is between the high and low levels at IN−, as follows:

|  | Enabled | | Disabled | |
| --- | --- | --- | --- | --- |
|  | Read 1 | Read 0 | Read 1 | Read 0 |
| Q11 | On | Off | Off | Off |
| Q12 | Off | On | On | On |
| Q13 | On | Off | Off | Off |
| Q14 | Off | On | On | On |
| I thru $R_2$ | 0 | $\sim I_D$ | $\sim I_D$ | $\sim I_D$ |
| IN+ (Q11 base) | High Relative A | Low Relative A | Low Relative A | Low Relative A |
| IN− (Q14 base) | Low Relative B | High Relative B | High Relative B | High Relative B |
| Node A | Low | Low | High | High |
| Node B | High | High | Low | Low |

Accordingly, the present invention provides signal amplifying, buffering, and output enable/inhibit by use of split biasing with a differential transistor pair circuit. Current is steered to provide a logic output signal in accordance with a logic input signal when circuit operation is enabled. Circuit output is held at a constant level without regard to the circuit input signal level when circuit operation is inhibited. Because the enable/inhibit circuit is also used to bias the differential amplifier stages in both the enabled and inhibited modes, a standby current is not required and standby power loss is reduced.

The present circuit operates efficiently with a low voltage power supply, for instance, in a battery operated device operating on weak batteries, because there are few gating transistors in series that would affect circuit operation. The present invention substantially reduces layout area by reducing the number of high current carrying transistors and by reducing the size of each transistor proportional to the amount of current it must carry. Such advantageous results are the effect of splitting the driving current evenly through one leg of each transistor pair along the selected current path. Accordingly, any number of differential amplifiers can be controlled by the enable/inhibit circuitry, as for example, in memory devices having several controlled memory cells.

One advantage of the present invention is the novel control of several differential stages by a single enable stage. For example, in memory device, all the memory cells in a particular row or column may be enabled simultaneously by a single enable circuit. Thus, a differential transistor pair is associated with each memory cell; several differential transistor pairs are coupled in parallel at circuit nodes A and B for control by enable/inhibit stage 25.

The reduction in component size and in the number of components required also eliminates the requirement of complex biasing signals for multiple stage amplifiers. By reducing current carrying requirements, parasitic capacitance is significantly reduced and circuit response is radically improved. The present invention may be operated in a memory device such as a bipolar static RAM at speeds as fast as five nanoseconds. Such high speed memories readily find application in many electronic devices, such as microcircuit testing devices where test vectors are rapidly moved through the tester and into the tested device.

The foregoing was given for purposes of illustration and example. It will be appreciated by those skilled in the art that the present invention is readily practiced in various equivalent applications and embodiments. For example, the enable/inhibit stage may be modified as desired, the only requirement being that the bias signal provided to circuit nodes A and B be balanced to enable circuit operation and be split to inhibit circuit operation. Additionally, the present invention may find application in devices other than solid state memory devices. For example, the invention may be used to control differential amplifiers. Therefore, the scope of the invention should be limited only by the breadth of the claims.

I claim:

1. A circuit for steering a current supplied by a current source to produce a predetermined circuit output signal in response to a selected circuit differential input signal, comprising:
   a first differential amplifier, coupled to receive said current, for steering said current along a first current path in response to said selected circuit differential input signal;
   a second differential amplifier, coupled to receive said current, for alternatively steering said current along a second current path in response to said selected circuit differential input signal;
   output means, coupled to receive said current, for producing said predetermined circuit output signal according to which of said first and second current paths said current is steered; and
   means, coupled to said first and second differential amplifiers, for producing a balanced control signal to selectively enable each of said first and second differential amplifiers, whereby said current is steered along a selected one of said first and second current paths in response to said selected circuit differential input signal to produce said predetermined circuit output signal; and for alternatively producing a split control signal to selectively inhibit each of said first and second differential amplifiers, whereby said current is steered along a predetermined one of said first and second current paths to continually produce a corresponding circuit output signal without regard to said selected circuit differential input signal.

2. A memory enable/inhibit circuit, comprising:

a first differential transistor pair having an input terminal coupled to receive a first logic input signal and being operable to steer a current along a first current path in response thereto, and having a first bias terminal coupled to receive a first portion of a bias signal;

a second differential transistor pair having an input terminal coupled to receive a second logic input signal and being operable to steer said current along a second current path in response thereto, and having a second bias terminal coupled to receive a second portion of said bias signal; and output means, having a control terminal coupled to a node along said second current path, for producing a first logic output signal when said current is steered along one of said current paths and for producing a second logic output signal when said current is steered along the other of said current paths.

3. The circuit of claim 2, further comprising:

enable/inhibit means, coupled to said first and second bias/enable terminals, for producing said bias signal, wherein circuit operation is enabled when a balanced bias signal is coupled to said first and second bias terminals, and wherein circuit operation is inhibited when a split bias signal is coupled to said first and second bias terminals.

4. The circuit of claim 3, wherein said first differential transistor pair includes:

(a) a first transistor having a first terminal coupled to a current source, a second terminal coupled to a current sink, and a control terminal coupled to receive said first logic input signal; and (b) a second transistor having a first terminal coupled to said current source, a second terminal coupled to said current sink, and a control terminal coupled to receive said bias signal; and wherein said second differential transistor pair includes:

(a) a third transistor having a first terminal coupled to said current source, a second terminal coupled to said current sink, and a control terminal coupled to receive said second logic input signal; and (b) a fourth transistor having a first terminal coupled to said current source, a second terminal coupled to said current sink, and a control terminal coupled to receive said bias signal.

5. The circuit of claim 4, said output means including a fifth transistor coupled between said current source and said second and fourth transistors and having a first terminal coupled to said current source, a control terminal coupled to said second and fourth transistors, and a second terminal coupled to provide said first logic output signal when current is steered along one of said current paths and to provide said second logic output signal when current is steered along the other of said current paths.

6. The circuit of claim 5, said enable/inhibit means including:

a first bias source coupled to said first bias terminal, for providing said first portion of said bias signal thereto;

a second bias source coupled to said second bias terminal, for providing said second portion of said bias signal thereto; and means, coupled to said first and second bias sources, for selectably operating said bias sources to produce a balanced bias signal when circuit operation is enabled and to produce a split bias signal when circuit operation is inhibited.

7. A memory enable/inhibit circuit, comprising:

a first differential amplifier including:

(a) a first transistor having a first terminal connected to a current source, a second terminal connected to a current sink, and a control terminal coupled to receive a first logic input signal; and (b) a second transistor having a first terminal coupled to said current source, a second terminal coupled to said current sink, and a control terminal coupled to receive a bias signal;

a second differential amplifier including:

(a) a third transistor having a first terminal coupled to said current source, a second terminal coupled to said current sink, and a control terminal coupled to receive a second logic input signal; and (b) a fourth transistor, having a first terminal coupled to said current source, a second terminal coupled to said current sink, and a control terminal coupled to receive said bias signal;

an output amplifier, including:

(a) a fifth transistor having a first terminal coupled to said current source, a control terminal coupled to the first terminal of said second and fourth transistors, and a second terminal for producing a first logic output signal in response to said first logic input signal and for producing a second logic output signal in response to said second logic input signal; and (b) means, coupled between said fifth transistor first terminal and control terminal to produce a control voltage at said transistor control terminal; and enable/inhibit means, including:

(a) a first bias source coupled to said first bias terminal;

(b) a second bias source coupled to said second bias terminal; and (c) a differential transistor pair coupled to operate said first and second bias sources to selectably provide a balanced bias signal when circuit operation is enabled and to provide a split bias signal when circuit operation is inhibited.

8. The circuit of claim 7, said first and third transistors being operable to provide a first current path when a first logic signal is coupled to the control terminal of said first transistor;

said second and fourth transistors being operable to provide a second current path when said second logic input signal is coupled to the control terminal of said fourth transistor; and said fifth transistor being operable to provide a first logic output signal and a second logic output signal corresponding to which of a respective one of said first and second current paths is provided.

9. The circuit of claim 8, said first bias source and said second bias source being coupled to provide a balanced bias signal to said first and second bias terminals to operate said second and third transistors when circuit operation is enabled, and being operable to provide a split bias signal to said first and second bias terminals to select a predetermined one of said first and second current paths, and to produce a corresponding logic output signal without regard to said first and second logic input signals when circuit operation is inhibited.

10. In a memory circuit including a first differential transistor pair having an input terminal coupled to receive a first logic input signal and being operable to steer a current along a first current path in response thereto having a second differential transistor pair having a second input terminal coupled to receive a second logic input signal and being operable to steer a current along said second current path in response thereto, and having an output stage operable to produce a first logic output signal and a second logic output signal in response to the one of said corresponding first and second selected current paths along which current is steered, a method for enabling and disabling circuit operation, comprising:

providing a bias signal to a bias terminal of each differential transistor pairs whereby circuit operation is enabled such that said first and second current paths may readily be selected in response to said corresponding first and second logic input signals; and providing a split bias signal to said bias terminal, whereby circuit operation is inhibited, such that a predetermined current path is continuously selected without regard to said first and second logic input signals.

11. The method of claim 10, further comprising the steps of:

providing a first component of said bias signal to one of said differential transistor pairs; and providing a second component of said bias signal which is balanced relative to said first component when circuit operation is enabled and which is split relative to said first component when circuit operation is inhibited.

* * * * *